(12) United States Patent
Sim

(10) Patent No.: US 8,221,961 B2
(45) Date of Patent: Jul. 17, 2012

(54) METHOD OF MANUFACTURING SEMICONDUCTOR DEVICES

(75) Inventor: Guee Hwang Sim, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 782 days.

(21) Appl. No.: 12/346,436

(22) Filed: Dec. 30, 2008

(65) Prior Publication Data

US 2009/0181327 A1 Jul. 16, 2009

(30) Foreign Application Priority Data

Jan. 16, 2008 (KR) .................... 10-2008-0004767

(51) Int. Cl.
*G03F 7/26* (2006.01)

(52) U.S. Cl. ........ 430/311; 430/291; 430/313; 430/317; 430/330; 430/512; 430/514

(58) Field of Classification Search .................. 430/291, 430/311, 313, 317, 330, 512, 514
See application file for complete search history.

(56) References Cited

U.S. PATENT DOCUMENTS 5,858,621 A * 1/1999 Yu et al. ........................ 430/313

2003/0186172 A1 * 10/2003 Lu ................................. 430/314

FOREIGN PATENT DOCUMENTS

| JP | 2004-054286 | 2/2004 |
|----|-------------|--------|
| KR | 100170323 B1 | 10/1998 |

* cited by examiner

*Primary Examiner* — John Chu
(74) *Attorney, Agent, or Firm* — Kilpatrick Townsend & Stockton LLP

(57) ABSTRACT

The present invention relates to a method of manufacturing semiconductor devices. According to the method, an etch target layer, a chemically amplified photoresist layer, and an Anti-Reflective Coating (ARC) layer are first sequentially formed over a semiconductor substrate. An exposure process is performed in order to form exposure portions in the photoresist layer. A thermal process is performed so that a decrosslinking reaction is generated in the ARC layer on the exposure portions. A development process is performed in order to form photoresist layer patterns and ARC layer patterns by removing the ARC layer at portions in which the decrosslinking reaction has occurred and the exposure portions. A silylation process is performed in order to form silylation patterns on sidewalls of each of the photoresist layer patterns. The ARC layer patterns and the photoresist layer patterns are removed. The etch target layer is patterned using the silylation patterns as an etch mask.

8 Claims, 2 Drawing Sheets

METHOD OF MANUFACTURING SEMICONDUCTOR DEVICES

CROSS-REFERENCES TO RELATED APPLICATION

The present application claims priority to Korean patent application number 10-2008-0004767, filed on Jan. 16, 2008, which is incorporated by reference in its entirety.

BACKGROUND OF THE INVENTION

The present invention relates to a method of manufacturing semiconductor devices and, more particularly, to a method of manufacturing semiconductor devices, which is capable of implementing micro patterns depending on the higher integration of semiconductor devices while simplifying process steps.

In the manufacturing process of semiconductor devices, a process of etching an etch target material layer formed over a semiconductor substrate in order to form transistors or metal lines is indispensably used. A pattern of the material layer to be etched is decided by making a photoresist layer coated thereon photoresist layer patterns in a photolithography process. This is because, while the etching process is performed, the photoresist layer patterns function as an etch barrier against non-etched portions. Each of the photoresist layer patterns formed in the photolithography process has an etch rate in contrast to an etch rate of each of the etch target material layers while etching is performed. Such an etch rate can be defined into the following etch selectivity.

Etch selectivity=(etch rate of etch target material layer)/(etch rate of photoresist layer)

The size of a pattern to be formed gradually decreases due to the higher integration of semiconductor devices, so it is difficult to form a pattern using once exposure process due to the limited resolution of exposure equipment. Accordingly, research has been done on a pattern doubling technology for overcoming the limited resolution of exposure equipment in various ways, and used on the spot. However, the conventional double patterning technology requires twice etching processes. The twice etching processes have limited applications to products of 40 nm or less because they are difficult to control overlay. Further, the twice etching processes are problematic in that, since several process steps are performed as described above, the manufacturing cost is high and the turn-around time is long, resulting in low productivity.

BRIEF SUMMARY OF THE INVENTION

The present invention is directed towards a method of manufacturing semiconductor devices, which is capable of implementing micro patterns depending on the higher integration of semiconductor devices while simplifying process steps.

In accordance with a method of manufacturing semiconductor devices according to the present invention, an etch target layer, a chemically amplified photoresist layer, and an Anti-Reflective Coating (ARC) layer are first sequentially formed over a semiconductor substrate. An exposure process is performed in order to form exposure portions in the photoresist layer. A thermal process is performed so that a decrosslinking reaction is generated in the ARC layer on the exposure portions. A development process is performed in order to form photoresist layer patterns and ARC layer patterns by removing the ARC layer at portions in which the decrosslinking reaction has occurred and the exposure portions. A silylation process is performed in order to form silylation patterns on sidewalls of each of the photoresist layer patterns. The ARC layer patterns and the photoresist layer patterns are removed. The etch target layer is patterned using the silylation patterns as an etch mask.

In the present invention, the ARC layer at the portions in which the decrosslinking reaction has occurred changes to materials that are dissolved in a photoresist developer.

In the present invention, the silylation patterns are formed from $SiO_x$ on the sidewalls of each of the photoresist layer patterns, by performing a silylation process of making silylators, including silicon, react to each other.

In the present invention, the silylators include one or more silylation reagents selected from Hexamethyl Disilazane (HDMS), Tetramethyl Disilazane (TMDS), and Dimethylsilyl Dimethylamine (DMSDMA).

In the present invention, the silylation reagents include liquefied silylation reagents or gaseous silylation reagents.

In the present invention, the ARC layer on the photoresist layer patterns are crosslinked at the time of the thermal process.

In the present invention, the ARC layer of crosslinked portions function to prevent a silylation reaction from occurring on the photoresist layer patterns at the time of the silylation process.

In the present invention, a pitch of the photoresist layer patterns is twice larger than that of the patterned etch target layer.

The present invention can achieve a pattern doubling technology for forming target patterns having a pitch half the pitch of photoresist layer patterns using the photoresist layer patterns, which are formed by only an exposure process without an additional etching process, in order to implement ultramicro patterns. In particular, silylation patterns formed from $SiO_x$ are formed on both sidewalls of each of the photoresist layer patterns using a silylation process. Accordingly, ultramicro patterns, which will be finally formed, can be formed using an etching process using the silylation patterns as an etch mask. Due to this, several process steps can be omitted and the manufacturing cost can be saved, resulting in improved productivity.

DESCRIPTION OF SPECIFIC EMBODIMENT

Figure 1A:
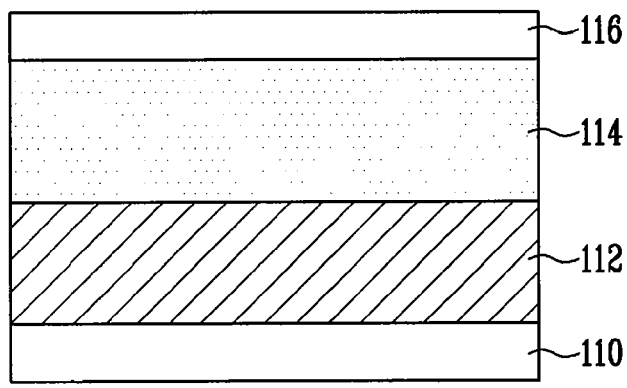
FIGS. 1A to 1F are sectional views showing a method of manufacturing semiconductor devices according to an embodiment of the present invention.

Hereinafter, the present invention will be described in detail in connection with a specific embodiment with reference to the accompanying drawings. The present embodiment is provided to complete the disclosure of the present invention and to allow those having ordinary skill in the art to understand the scope of the present invention. When it is said that any part, such as a layer, film, area, or plate, is positioned on another part, it means the part is directly on the other part or above the other part with at least one intermediate part. To clarify multiple layers and regions, the thickness of the layers is enlarged in the drawings.

FIGS. 1A to 1F are sectional views showing a method of manufacturing semiconductor devices according to an embodiment of the present invention.

Referring to FIG. 1A, an etch target layer 112, a chemically amplified photoresist layer 114, and an Anti-Reflective Coating (ARC) layer 116 are sequentially formed over a semiconductor substrate 110. Here, the etch target layer 112 may include a silicon substrate in which trenches, etc. will be formed, and may include any kind of a film, such as an insulating layer or a conductive layer used in a semiconductor fabrication process. More specifically, the chemically amplified photoresist layer 114 is formed on the etch target layer 112 using a chain chemical reaction of active acid in order to form micro patterns. The ARC 116 for preventing a subsequent silylation reaction from occurring on non-exposure portions of the photoresist layer 114 on the photoresist layer 114.

Figure 1B:
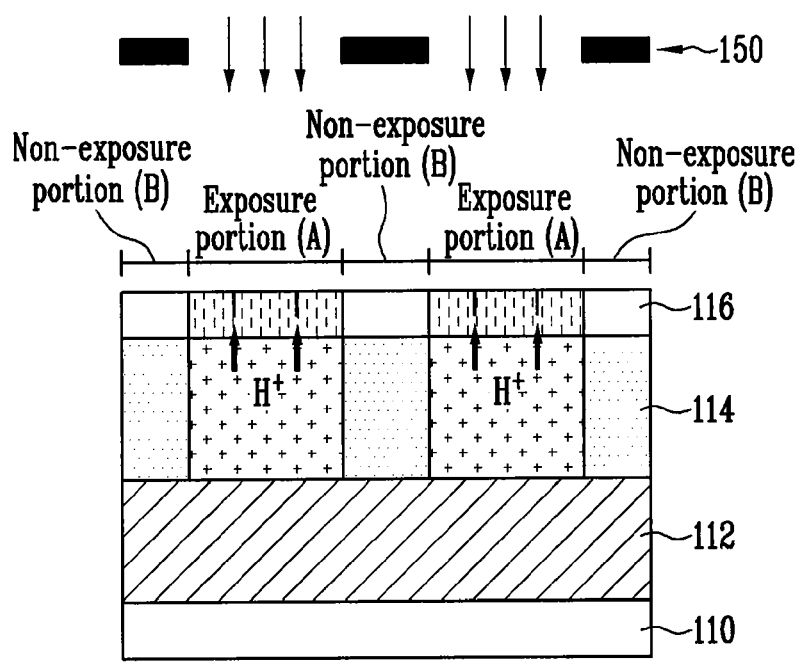

Referring to FIG. 1B, an exposure process and a thermal process (for example, a baking process) are performed on the photoresist layer 114 and the ARC layer 116, formed over the semiconductor substrate 110, using exposure masks 150 each having a specific pattern. More specifically, exposure portions A are formed in the photoresist layer 114 using an exposure process, and acid ($H^+$) is generated from a photoacid generator (PAG) within the exposure portions A of the photoresist layer 114. Further, the acid ($H^+$) is spread by the baking process, thereby activating an acid hydrolysis reaction. Consequently, the exposure portions A of the photoresist layer 114 becomes a state in which they are dissolved in a developer. Some of the acid ($H^+$) within the exposure portions A of the photoresist layer 114 spread into the exposure portions A of the ARC layer 116 on the exposure portions A of the photoresist layer 114, thus generating a decrosslinking reaction within the exposure portions A of the ARC layer 116. That is, the exposure portions A of the ARC layer 116 on the exposure portions A of the photoresist layer 114 change to materials, which are dissolved in a photoresist developer, because a decrosslinking reaction is generated by acid hydrolysis.

Meanwhile, at the time of the baking process, a crosslinking reaction is generated in non-exposure portions B of the ARC layer 116. Accordingly, at the time of a subsequent silylation process, the occurrence of a silylation reaction is prevented on the non-exposure portions B of the photoresist layer 114. For reference, if exposure equipment upon exposure is exposure equipment capable of resolving a photoresist layer that can be subsequently silylated, any kind of exposure equipment may be used irrespective of a light source. Further, a pitch of the patterns of the exposure masks 150, used at the time of exposure, is twice larger than a pitch of patterns that will be finally formed. Accordingly, if an exposure process is performed using wider patterns, the limit resolution of exposure equipment can be overcome.

Figure 1C:
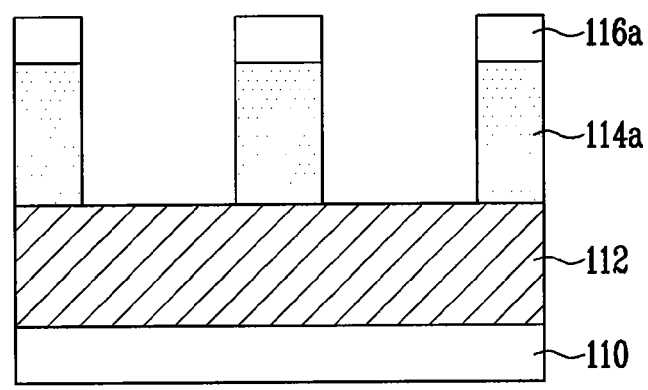

Referring to FIG. 1C, the exposure portions A of the photoresist layer 114 and the exposure portions A of the ARC layer 116, having a decrosslinking state, on the exposure portions A of the photoresist layer 114 are removed using a development process, so ARC layer patterns 116a and photoresist layer patterns 114a can be formed at the same time. Accordingly, the photoresist layer patterns 114a and the ARC layer patterns 116a, each having a pitch twice the pitch of patterns that will be finally formed, can be formed over the semiconductor substrate 110 including the etch target layer 112.

Figure 1D:
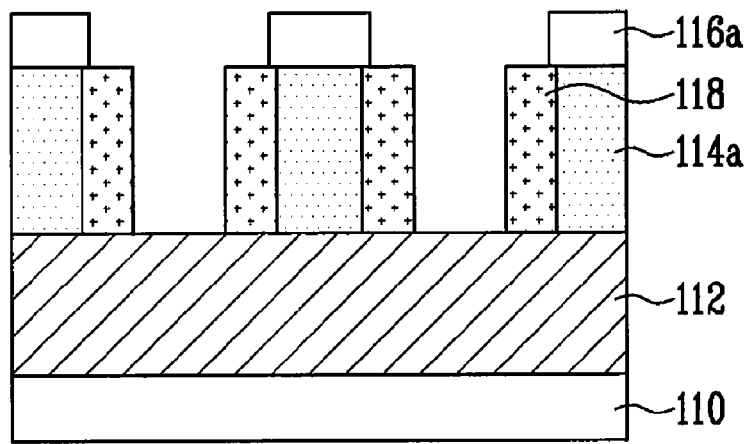

Referring to FIG. 1D, silylation patterns 118 formed from $SiO_x$ are formed on exposed sidewalls of the photoresist layer patterns 114a by performing a silylation process of making silylators, including silicon (Si), react to each other. That is, silicon ions included in the silylators react to oxygen ions of activated ions (—OH radicals) of an organic compound, including activated hydrogen ions (i.e., —OH, —SH, etc.), thereby forming $SiO_x$. For example, the silylation patterns 118 formed from $SiO_2$ may be formed.

Here, the silylators may include one or more silylation reagents selected from Hexamethyl Disilazane (HDMS), Tetramethyl Disilazane (TMDS), and Dimethylsilyl Dimethylamine (DMSDMA). The silylation reagents may use a liquefied silylation or selectively a gaseous silylation, if appropriate. Meanwhile, on upper portions of the photoresist layer patterns 114a (that is, the non-exposure portions B of the photoresist layer 114), the ARC layer patterns 116a crosslinked to a polymer function to prevent the photoresist layer patterns 114a from reacting to the silylators at the time of the baking process.

Due to this process, the silylation patterns 118, formed from $SiO_x$ on the sidewalls of the photoresist layer patterns 114a, may function to further increase an etch selectivity for the underlying etch target layer 112. In particular, since the silylation patterns 118 are formed on both sides of the photoresist layer patterns 114a through the silylation process, an additional etching process of forming these patterns can be omitted and, therefore, process steps can be simplified.

Figure 1E:
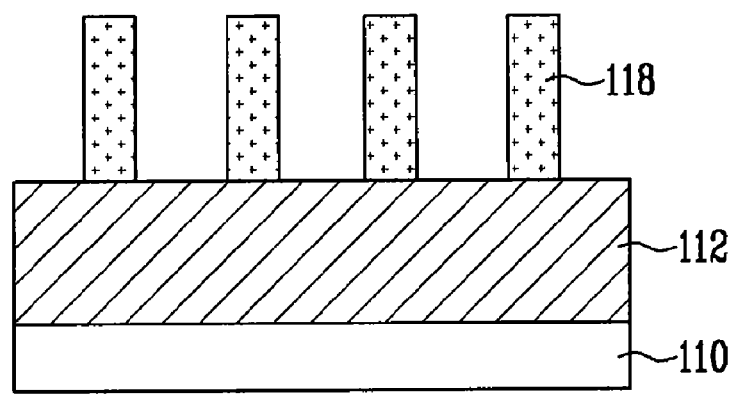

Referring to FIG. 1E, the ARC layer patterns 116a and the photoresist layer patterns 114a are removed. Accordingly, the silylation patterns 118, which will be used as an etch mask when etching the etch target layer 112, remain over the semiconductor substrate 110 including the etch target layer 112. The ARC layer patterns 116a and the photoresist layer patterns 114a may be removed using an ashing process, a cleaning process or the like.

Figure 1F:
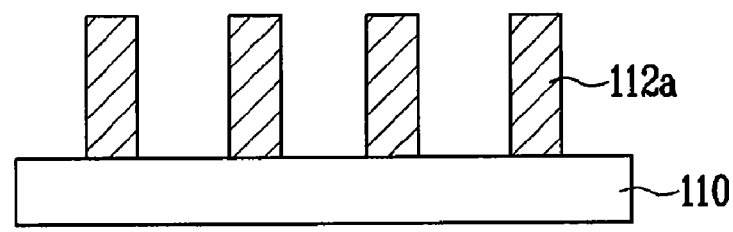

Referring to FIG. 1F, etch target layer patterns 112a, each having a micro size, can be formed on the semiconductor substrate 110 using an etching process employing the silylation patterns 118 having a high etch selectivity for the underlying etch target layer 112. That is, the final etch target layer patterns 112a formed as described above may have a pitch half the pitch of the photoresist layer patterns 114a.

As described above, the present invention can achieve a pattern doubling technology for forming target patterns having a pitch half the pitch of photoresist layer patterns using the photoresist layer patterns, which are formed by only an exposure process without an additional etching process, in order to implement ultra-micro patterns. In particular, silylation patterns formed from $SiO_x$ are formed on both sidewalls of each of the photoresist layer patterns using a silylation process. Accordingly, ultra-micro patterns, which will be finally formed, can be formed using an etching process using the silylation patterns as an etch mask. Due to this, several process steps can be omitted and the manufacturing cost can be saved, resulting in improved productivity.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of manufacturing semiconductor devices, the method comprising:

sequentially forming an etch target layer, a chemically amplified photoresist layer, and an Anti-Reflective Coating (ARC) layer over a semiconductor substrate;

performing an exposure process in order to form exposure portions in the photoresist layer;

performing a thermal process so that a decrosslinking reaction is generated in the ARC layer on the exposure portions;

performing a development process in order to form photoresist layer patterns and ARC layer patterns by removing the ARC layer at portions in which the decrosslinking reaction has occurred and the exposure portions;

performing a silylation process in order to form silylation patterns on sidewalls of each of the photoresist layer patterns;

removing the ARC layer patterns and the photoresist layer patterns; and patterning the etch target layer using the silylation patterns as an etch mask.

2. The method of claim 1, wherein the ARC layer at the portions in which the decrosslinking reaction has occurred changes to materials that are dissolved in a photoresist developer.

3. The method of claim 1, wherein the silylation patterns are formed from $SiO_x$ on the sidewalls of each of the photoresist layer patterns, by performing a silylation process of making silylators, including silicon, react to each other.

4. The method of claim 3, wherein the silylators include one or more silylation reagents selected from Hexamethyl Disilazane (HDMS), Tetramethyl Disilazane (TMDS), and Dimethylsilyl Dimethylamine (DMSDMA).

5. The method of claim 4, wherein the silylation reagents include liquefied silylation reagents or gaseous silylation reagents.

6. The method of claim 1, wherein the ARC layer on the photoresist layer patterns are crosslinked at the time of the thermal process.

7. The method of claim 6, wherein the ARC layer of crosslinked portions function to prevent a silylation reaction from occurring on the photoresist layer patterns at the time of the silylation process.

8. The method of claim 1, wherein a pitch of the photoresist layer patterns is twice larger than that of the patterned etch target layer.

* * * * *